(12) United States Patent
Riley et al.

(10) Patent No.: US 9,246,019 B2
(45) Date of Patent: Jan. 26, 2016

(54) HIGH EFFICIENCY RECTIFIER

(75) Inventors: Lee Spencer Riley, Outlane (GB); Ze Rui Chen, Fremont, CA (US)

(73) Assignee: Diodes Incorporated, Plano, TX (US)

( * ) Notice: Subject to any disclaimer, the term of this patent is extended or adjusted under 35 U.S.C. 154(b) by 1046 days.

(21) Appl. No.: 13/328,882

(22) Filed: Dec. 16, 2011

(65) Prior Publication Data

US 2012/0156862 A1 Jun. 21, 2012

Related U.S. Application Data

(60) Provisional application No. 61/424,523, filed on Dec. 17, 2010.

(51) Int. Cl.
| | | |
|---|---|---|
| H01L 21/04 | (2006.01) | |
| H01L 29/861 | (2006.01) | |
| H01L 29/66 | (2006.01) | |
| H01L 29/06 | (2006.01) | |
| H01L 29/40 | (2006.01) | |
| H01L 29/872 | (2006.01) | |

(52) U.S. Cl.
CPC .......... *H01L 29/861* (2013.01); *H01L 29/6609* (2013.01); *H01L 21/04* (2013.01); *H01L 29/0619* (2013.01); *H01L 29/407* (2013.01); *H01L 29/8725* (2013.01)

(58) Field of Classification Search
CPC ... H01L 21/04; H01L 29/407; H01L 29/8725; H01L 29/861; H01L 29/0619
USPC ....................................................... 438/478
See application file for complete search history.

(56) References Cited

U.S. PATENT DOCUMENTS

| | | | |
|---|---|---|---|
| 6,022,790 A | 2/2000 | Wagers et al. | |
| 8,466,051 B2* | 6/2013 | Lin et al. | 438/572 |
| 8,618,626 B2* | 12/2013 | Chao et al. | 257/484 |
| 2005/0260830 A1* | 11/2005 | Kwon et al. | 438/478 |
| 2009/0039384 A1 | 2/2009 | Hamerski et al. | |
| 2009/0065814 A1* | 3/2009 | Bhalla et al. | 257/230 |
| 2009/0065861 A1* | 3/2009 | Bhalla et al. | 257/331 |
| 2010/0032790 A1* | 2/2010 | Rinehimer | 257/475 |
| 2010/0108974 A1* | 5/2010 | Park | 257/3 |
| 2010/0244049 A1* | 9/2010 | Yamamoto et al. | 257/77 |
| 2011/0014771 A1* | 1/2011 | Dunton et al. | 438/385 |
| 2011/0024765 A1* | 2/2011 | Losee et al. | 257/77 |
| 2011/0140176 A1* | 6/2011 | Briere | 257/200 |
| 2011/0309470 A1* | 12/2011 | Grebs | 257/520 |

OTHER PUBLICATIONS

International Search Report for International Application No. PCT/US2011/065609 dated Oct. 25, 2012.

* cited by examiner

*Primary Examiner* — Nathan Ha

(57) ABSTRACT

A method for forming a rectifier device is provided. The method forms a first layer on a substrate, a second layer is formed on the first layer and a photoresist layer is deposited on the second layer in which a plurality of trench patterns are formed. A plurality of trenches are formed in the first layer and the second layer by etching based on the trench patterns in the photoresist. The method then laterally etches the second layer to expose a corner portion of the first layer at mesas formed in between the two trenches. A portion of the second layer is preserved at an edge of the rectifier device.

7 Claims, 20 Drawing Sheets

US 9,246,019 B2

HIGH EFFICIENCY RECTIFIER

CROSS REFERENCE TO RELATED APPLICATIONS

The present application claims priority to U.S. Provisional App. No. 61/424,523 for "HIGH EFFICIENCY RECTIFIER" filed Dec. 17, 2010, the contents of which is incorporated herein by reference in their entirety.

BACKGROUND

Particular embodiments generally relate to rectifiers.

Unless otherwise indicated herein, the approaches described in this section are not prior art to the claims in this application and are not admitted to be prior art by inclusion in this section Power electronics are associated with the efficient conversion, control and conditioning of electric power. This may include rectifying alternating current (AC) and converting this form of electrical power to direct current (DC). Diodes have been utilized as power rectifiers for many years and have been instrumental in providing power conversion for many of the systems which connect to the common AC power provided in most businesses and homes.

In the conventional processing of power rectifiers, an 'ACTIVE' photo mask and a 'TRENCH' photo mask are utilized to achieve the desired structure. This increases the number of processing steps and masks required.

SUMMARY

A method for forming a rectifier device is provided. The method forms a first layer on a substrate, a second layer is formed on the first layer and a photoresist layer is deposited on the second layer in which a plurality of trench patterns are formed. A plurality of trenches are formed in the first layer and the second layer by etching based on the trench patterns in the photoresist. The method then laterally etches the second layer to expose a corner portion of the first layer at mesas formed in between the two trenches. A portion of the second layer is preserved at an edge of the rectifier device.

The following detailed description and accompanying drawings provide a better understanding of the nature and advantages of the present invention.

DETAILED DESCRIPTION

Described herein are techniques for a rectifier structure. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
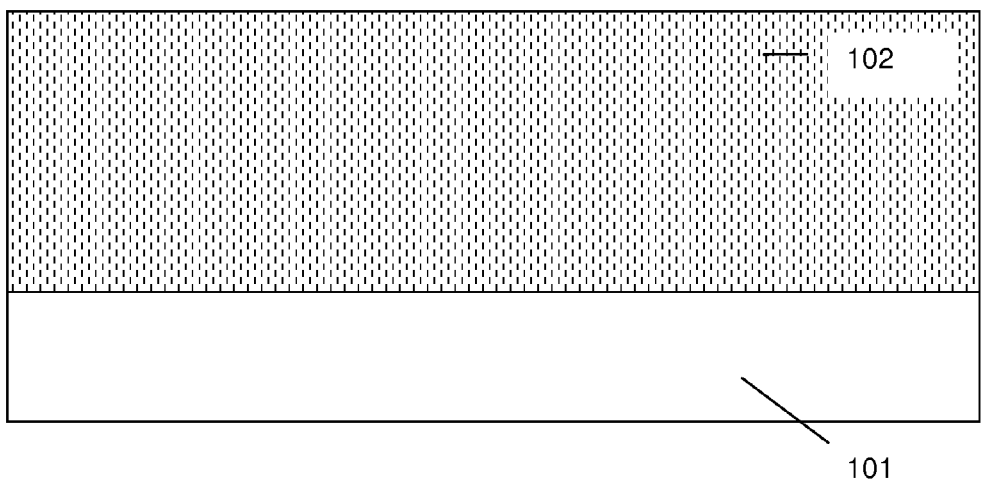
FIG. 1 shows a device structure that includes a highly doped substrate of a first conductivity type upon which a second layer comprising a lower doped material of the first conductivity type is formed to a specified thickness.

Particular embodiments create a semiconductor rectifier having low Vf using a method that has a reduced mask count. The mask count is reduced via a technique in the trench etch process and subsequent processing. For example, lateral etching is performed to reduce the mask count in a process that can be used to create a trenched super barrier rectifier (SBR) structure, a Trenched PIN, or Schottky rectifier structure. FIG. 1 shows a device structure that includes a highly doped substrate of a first conductivity type 101 upon which is formed a first layer 102 comprising a lower doped material of the first conductivity type to a specified thickness.

A first masking stage of this method may be referred to as 'GUARD RING' followed by 'TRENCH' and finally 'METAL'. There is a reduction in the mask count compared to conventional processing where conventional processing typically includes masking stages referred to as 'GUARD RING' followed by 'ACTIVE', 'TRENCH' and 'METAL'. The mask count is reduced by a combination of processing and trench mask design to achieve the function of the 'ACTIVE' and 'TRENCH' mask in one mask alone.

Figure 2:
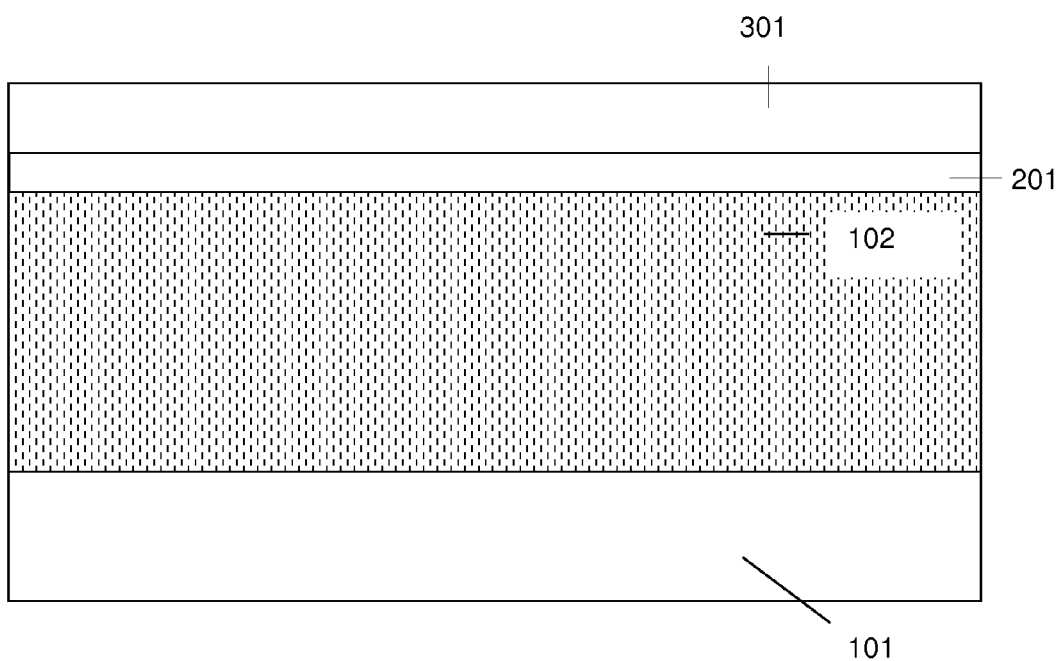
FIGS. 2-4 show forming a masking layer, depositing and patterning a photo resist layer, implanting into the first layer a second impurity type, and annealing to form regions of second conductivity type, according to one embodiment.
Figure 3:
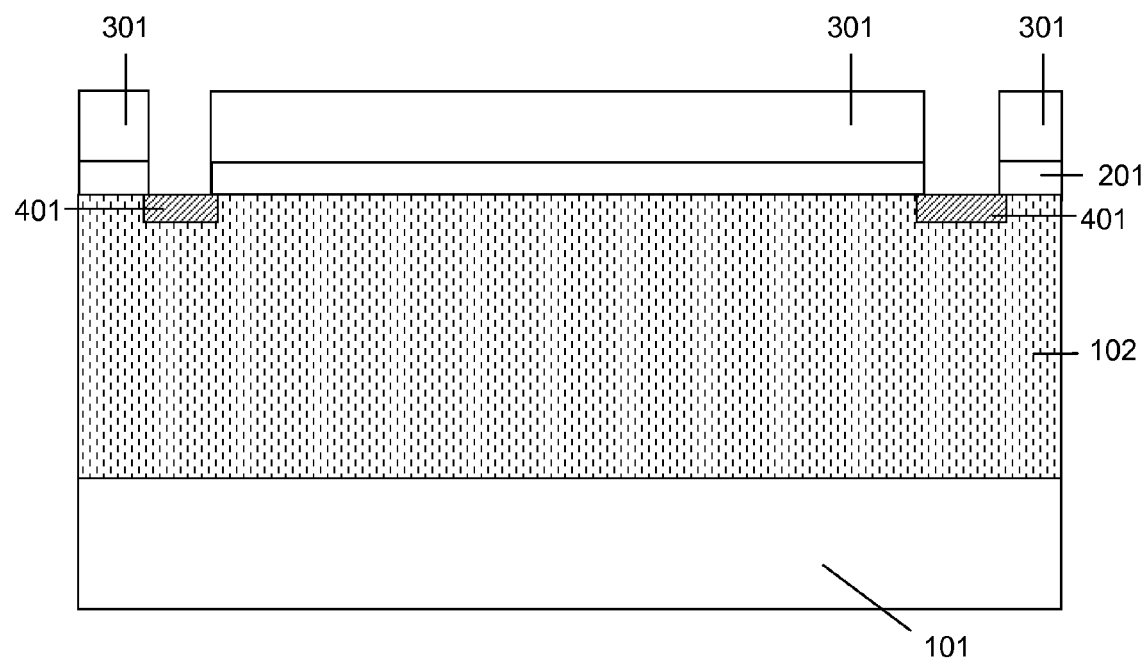
Figure 4:
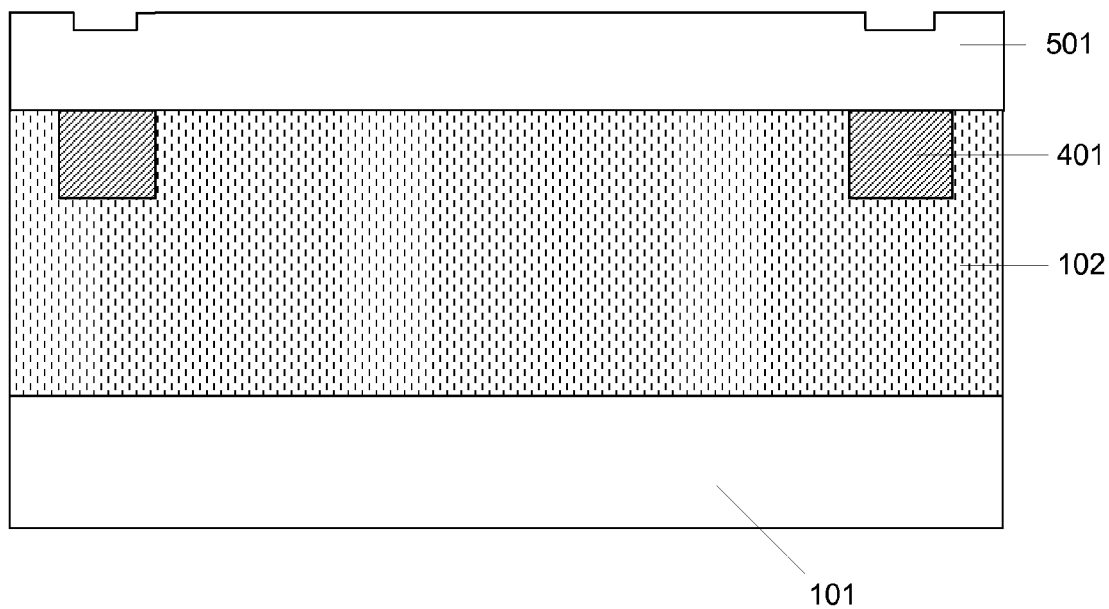

FIGS. 2-4 show forming a masking layer and an implant into the first layer 102 of a second impurity type according to one embodiment. This masking layer may be referred to as a GUARD RING masking stage. In FIG. 2, a second insulating layer 201 is formed on top of first layer 102. Layer 201 may typically be an oxide layer. A photoresist layer 301 is deposited on second layer 201. In FIG. 3, second layer 201 is etched and impurities of a second conductivity type implanted into first layer 102 to create regions 401. In FIG. 4, a third layer of insulating material 501 is formed by deposition or growth of second layer 201 on the top of the second layer 102 to a final thickness ranging from 0.5 um-2 um.

Figure 5:
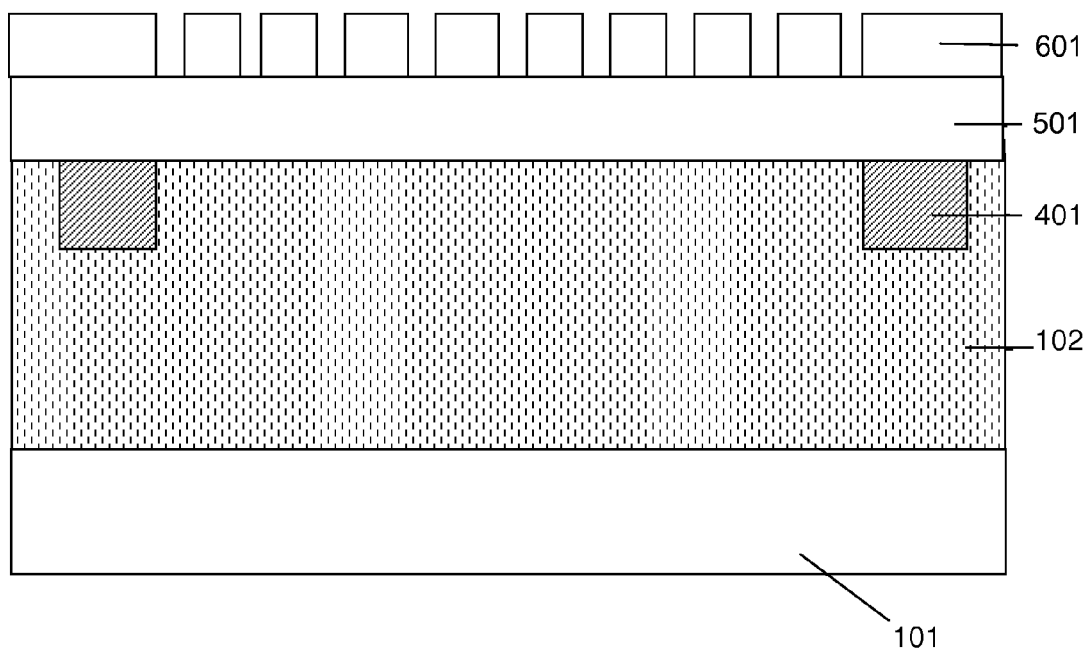
FIG. 5 shows a patterned photoresist layer formed on top of a third layer of material.

FIG. 5 shows a patterned photoresist layer 601 formed on top of third layer 501. As third layer of material 501 and second layer 201 are typically of the same material type, the identification of layer 201 is removed in this figure and subsequent figures, and third layer of material 501 is only shown. A trench pattern is then developed in photoresist 601. In one embodiment, the photo-resist is a thickness ranging from 0.7 um-3 um.

Figure 6A:
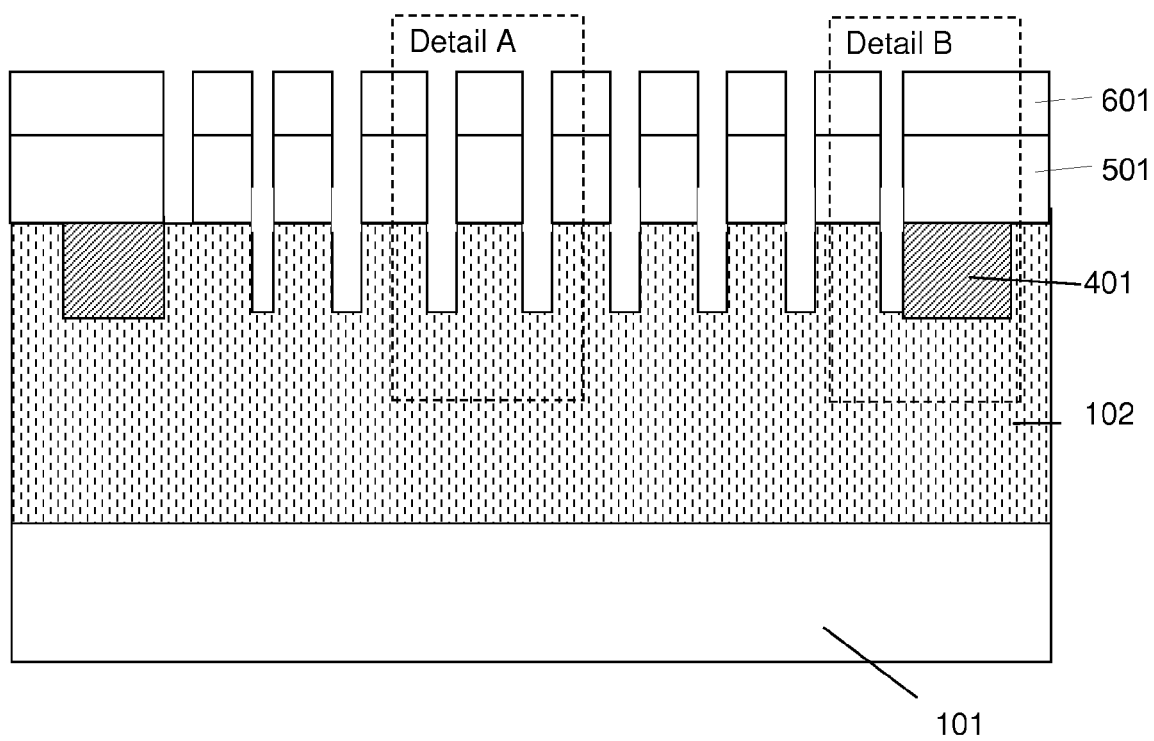
FIGS. 6a and 6b show trenches etched through the third layer, into the first layer.
Figure 6B:
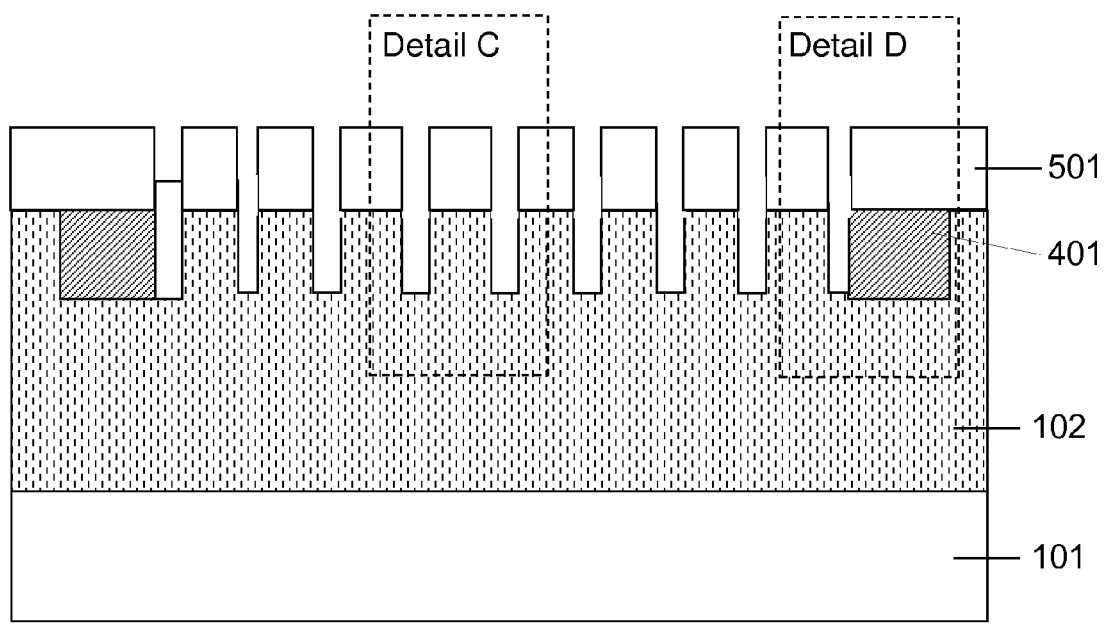

FIGS. 6a-6b show third layer 501 etched vertically using, for example, an anisotropic dry etch process. In a first three embodiments, photoresist layer 601 is left in-situ when first layer 102 is etched to form a plurality of trenches as in FIG. 6a. In a fourth embodiment the photo-resist layer is removed before the second layer is 102 etched as in FIG. 6b.

After the trenches in the first layer 102 have been etched, third layer 501 is laterally etched by various proposed methods. In the first three embodiments this step continues from the structure shown in FIG. 6a by lateral etching of third layer 501, exposing at least the top corners of first layer 102 between trenches, whilst vertical etching of third layer 501 is prevented due to the presence of photoresist 601. In the fourth embodiment continuing from the structure shown in FIG. 6b the vertical etching of the third layer 501 is not prevented, the final dimensions of which are defined by the initial thickness of the layer 501 and the lateral etching dimension required.

Various methods to laterally etching third layer 501 may be used. Detail A and Detail B will be described in more detail below. In particular embodiments, lateral etching of Detail A may laterally etch third layer 501. In some cases portions of third layer 501 may remain or may be completely removed. However, in both cases, a portion of third layer 501 in Detail B remains, as will be described in more detail below.

Figure 7:
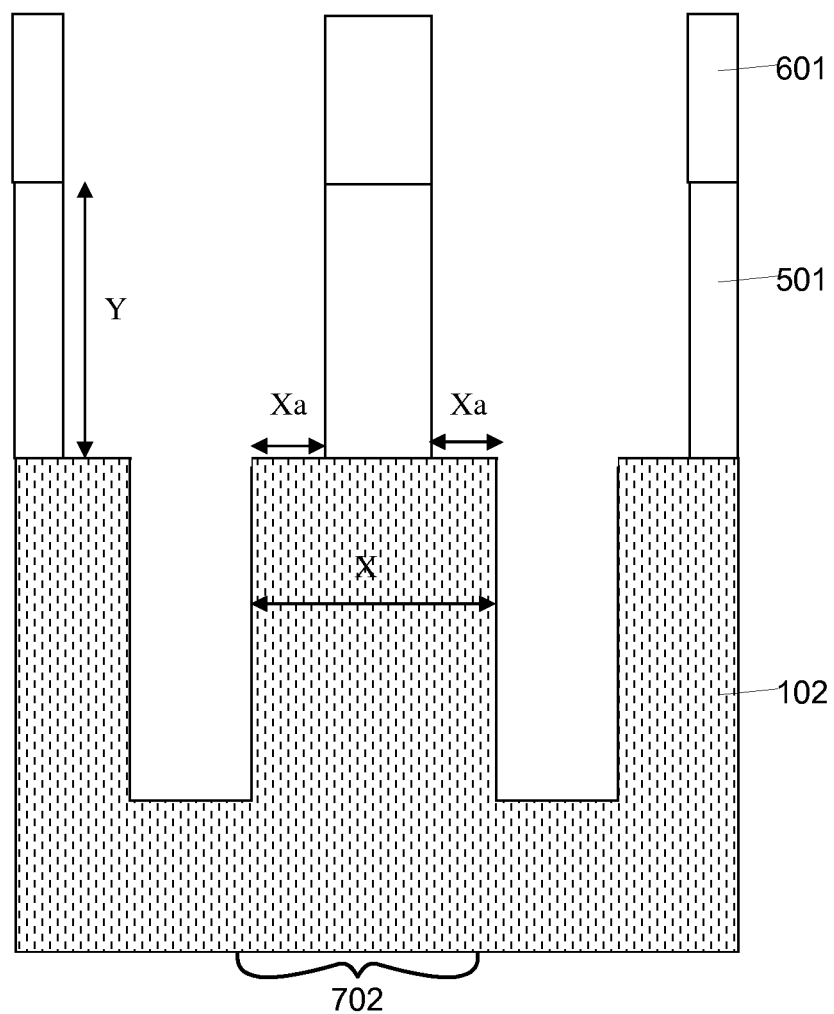
FIG. 7 show a first method of etching for Detail A according to one embodiment.

FIG. 7 shows a first method of etching for Detail A according to one embodiment. In one embodiment, simultaneous in-situ dry isotropic etching of the photoresist 601 and third layer 501 in, for example, a plasma etch tool after the etching of the first layer 102 may be performed. The prior trench etch step left a mesa portion of first layer 102 of lateral distance X between adjacent trenches, upon which are third layers 501 and resist 601 of the same lateral dimension, X. FIG. 7 shows a lateral etch of distance Xa. A portion of third layer 501 and photoresist 601 of lateral dimension X−2Xa is left after etching.

Figure 8A:
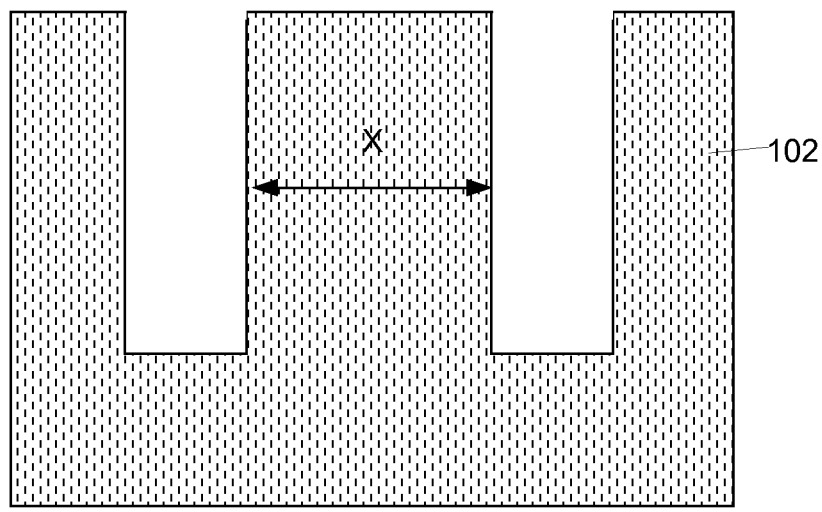
FIG. 8a shows a second method of etching for Detail A according to one embodiment.

FIG. 8a shows a second method of etching for Detail A according to one embodiment. In this case, the same etching method of FIG. 7 is used; however, the lateral etching step is continued until all of third layer 501 and photoresist 601 is removed. In this case, the length of the lateral etch may be X/2 from both sides.

Figure 8B:
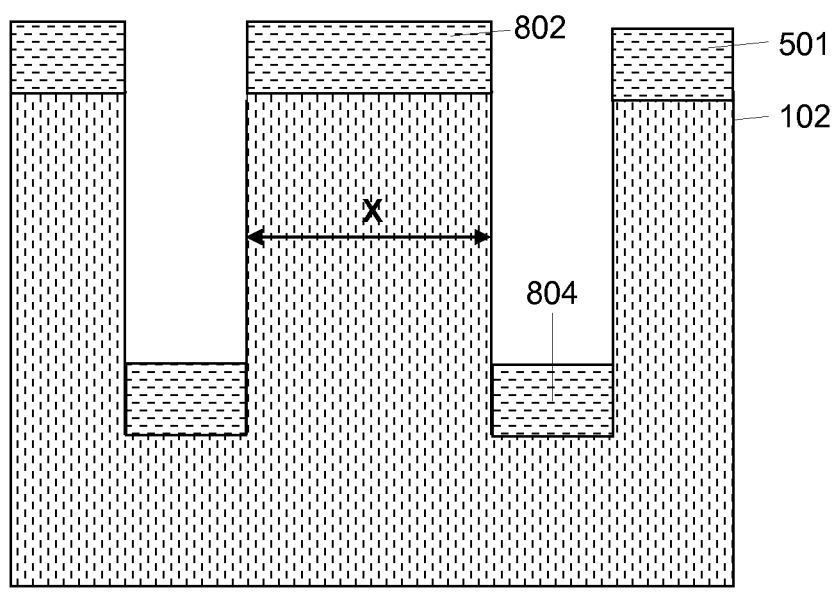
FIG. 8b shows a variation of the second method of etching according to one embodiment.

FIG. 8b shows a variation of the second method of etching according to one embodiment. The structure shown in FIG. 7 or 8a may be implanted with a second conductivity type at 0 (zero) degrees tilt to simultaneously create region 802 at the top surface of mesas, and region 804 at the bottom of the cut trench. Region 804 will provide a field relief zone at the bottom of the trench.

Figure 9:
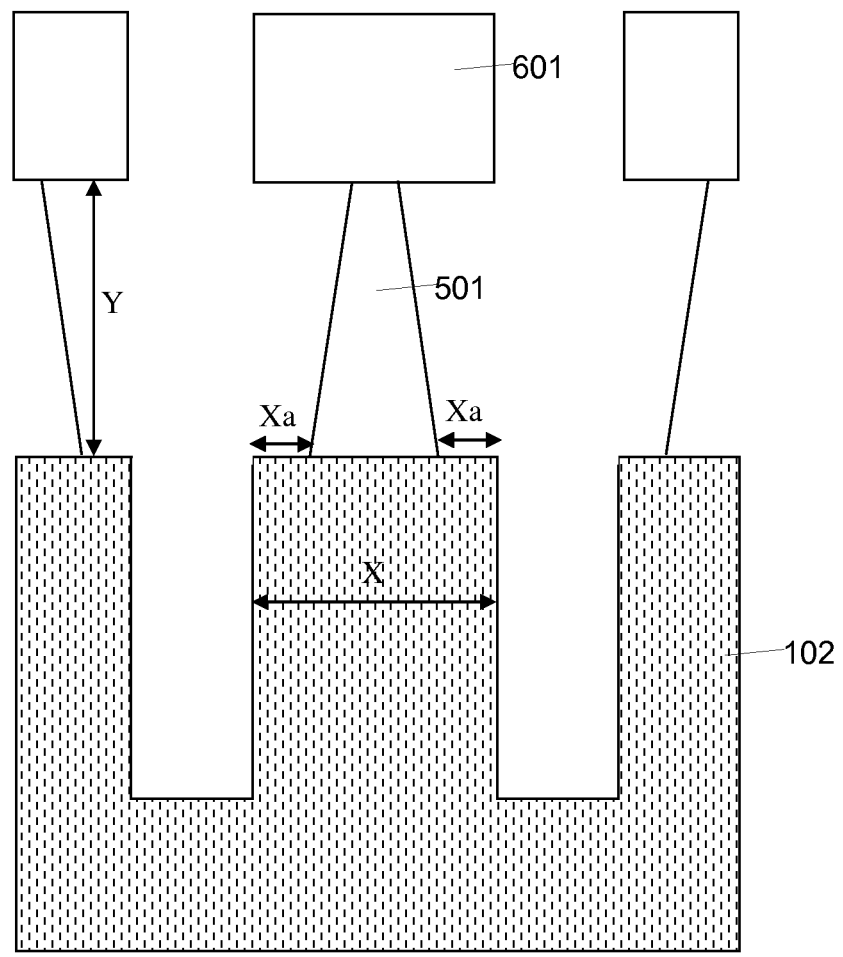
FIG. 9 shows a third method of etching for Detail A according to one embodiment.

FIG. 9 shows a third method of etching for Detail A according to one embodiment. A wet etching may be performed in this method. The wet etch may be an isotropic chemical solution that undercuts the photo resist layer 601 and reveals a portion of the mesa top surface of distance Xa.

Figure 10:
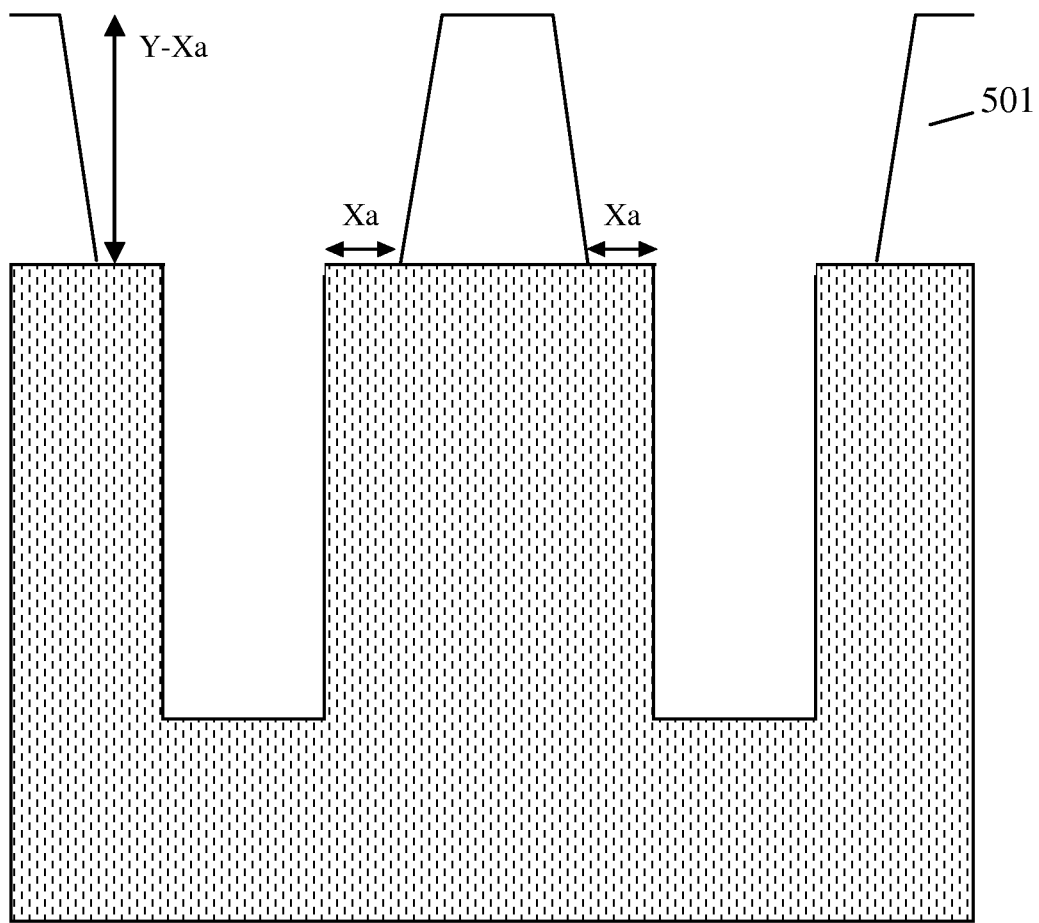
FIG. 10 shows a fourth method of etching for Detail C according to one embodiment.

FIG. 10 shows a fourth method of etching for Detail C according to one embodiment. A wet etch may also be performed in this method. The wet etch may be an isotropic chemical solution. The vertical dimension Y of layer 501 is reduced to a vertical dimension of (Y−Xa) of layer 501 in this embodiment. The initial vertical dimension of layer 501 and the required lateral etch defines the remaining vertical dimension of layer 501 in FIG. 10 and FIG. 14.

The above etching embodiments preserve an oxide thickness at the edge of the device, giving a termination structure to allow for reduced electric fields and increased reverse breakdown voltages of devices made using this method. This is now described in more detail with reference to Detail B and Detail D.

Figure 11:
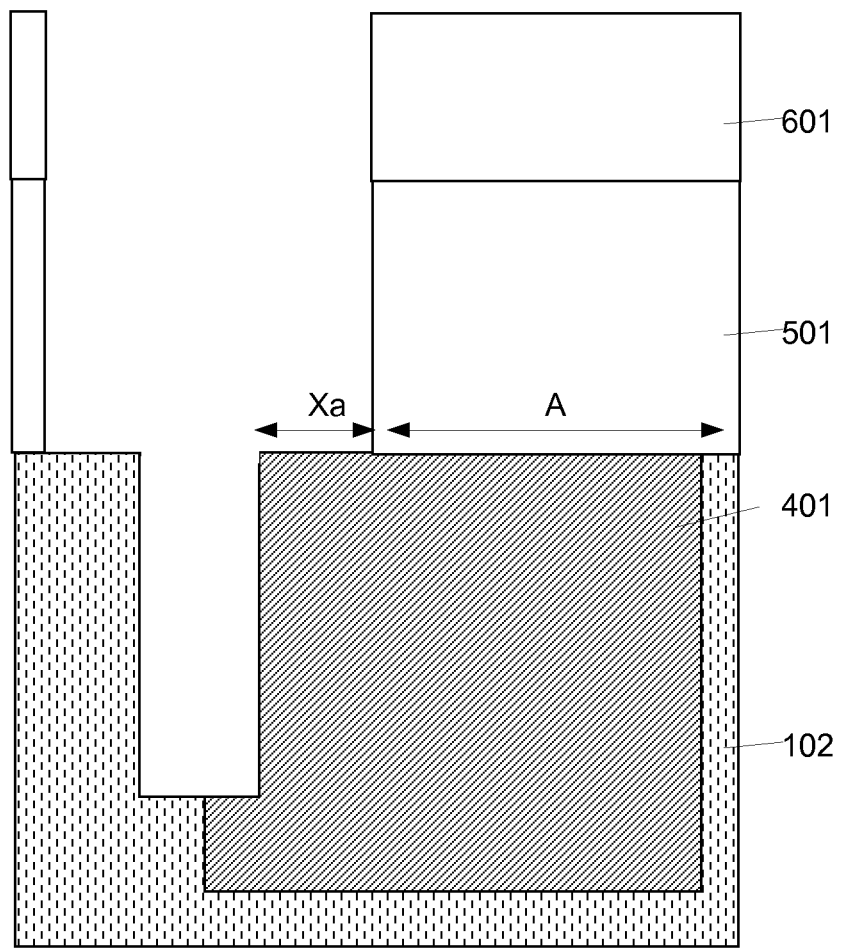
FIG. 11 shows an example of Detail B after performing the first method of etching according to one embodiment.

FIG. 11 shows an example of Detail B after performing the first method of etching according to one embodiment described with reference to FIG. 7. Implant 401 is shown in first layer 102, which may or may not abut outermost trench. Lateral etching of layer 501 and photo resist 601 has revealed the top surface to a distance Xa, whilst layer 501 and photoresist 601 of a length A are preserved at the edge of the device.

Figure 12:
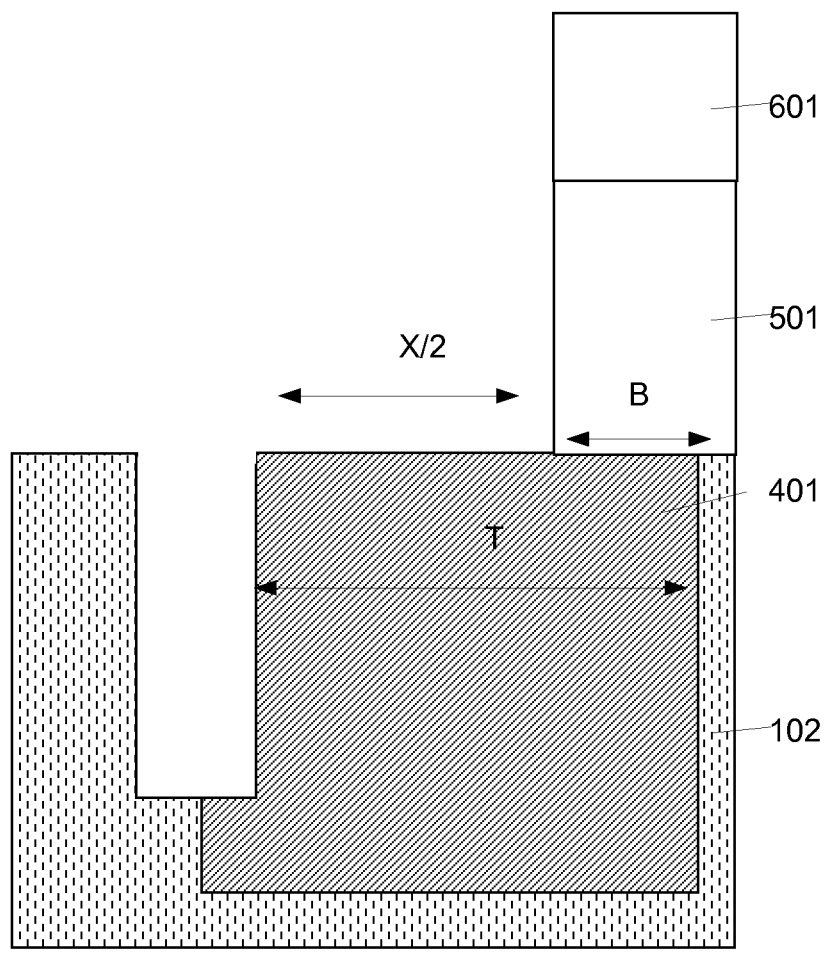
FIG. 12 shows an example of Detail B after performing the second method of etching according to one embodiment.

FIG. 12 shows an example of Detail B after performing a second method of etching according to one embodiment described with reference to FIG. 8a. Third layer 501 and photoresist 601 of a length B are preserved at the edge of the device. Length B is shorter than length A shown in FIG. 11 because the etch in the second method is continued until it removes all of third layer 501 and photoresist 601 in Detail A. However, thickness of layer 501 and resist layer 601 are sufficient such that a remaining thickness of layer 501 is preserved at the edge of the device.

Figure 13:
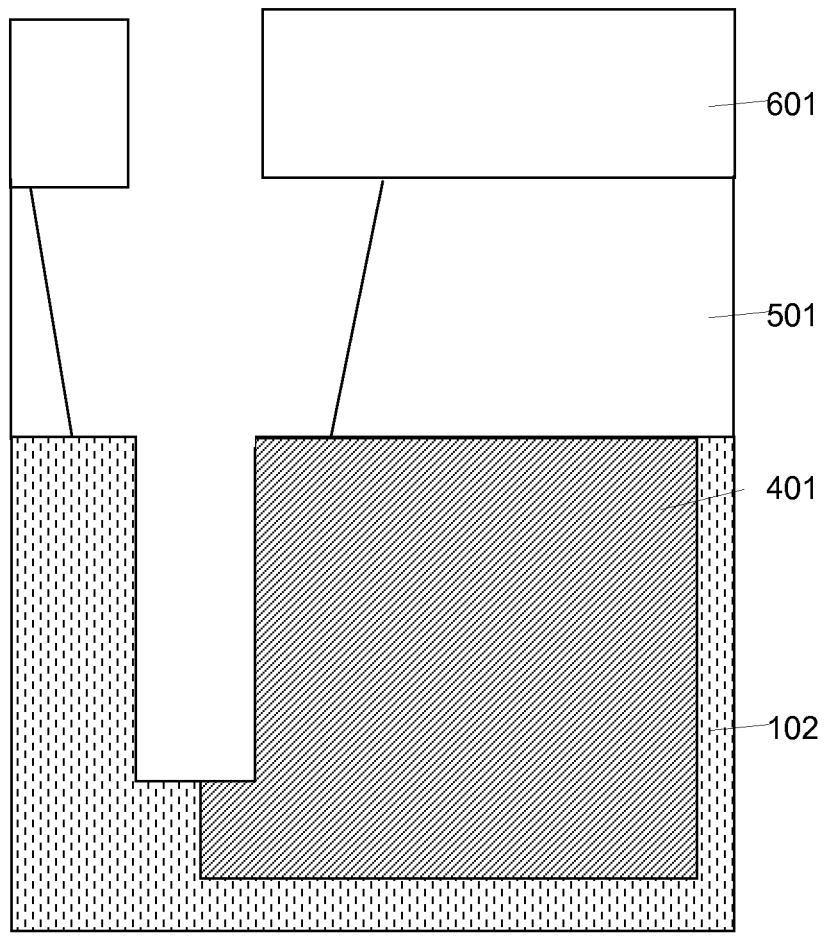
FIG. 13 shows an example of Detail B after performing the third method of etching according to one embodiment.

FIG. 13 shows an example of Detail B after performing the third method of etching according to one embodiment described with reference to FIG. 9. Third layer 501 and photoresist 601 are preserved at the edge of the device.

Figure 14:
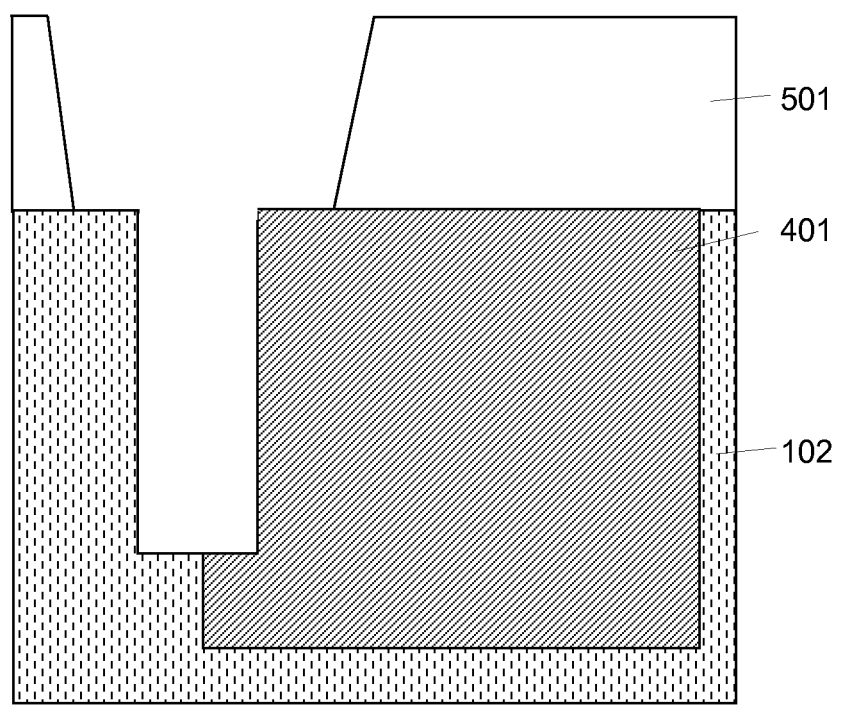
FIG. 14 shows an example of Detail D after performing the fourth method of etching according to one embodiment.
Figure 15:
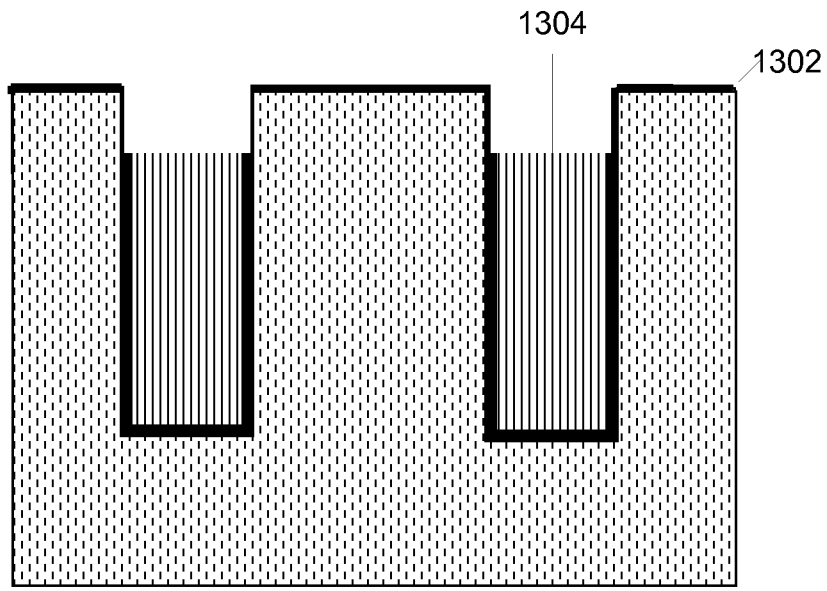
FIG. 15 shows the result of depositing or thermally growing a fourth insulating layer, depositing a conductive material, etching back the conductive material to just below the surface of the first layer.

FIG. 14 shows an example of Detail D after performing the fourth method of etching according to one embodiment described with reference to FIG. 10. Third layer 501 is preserved at the edge of the device. The remaining height of third layer 501 has been reduced to a vertical dimension of Y−Xa.

From the above descriptions and referenced drawings it can be appreciated that distance of lateral etching performed and the distance between adjacent trenches (herein referred to as the mesa) can be designed such that all of third layer 501 is completely removed or partially removed from the tops of the mesas. Particular embodiments are not limited to how much is removed. It can be envisaged that total removal can be achieved for a small mesa dimension, whereas portions of layer 501 will remain for wider mesa dimensions. Variations in third layer 501 thickness and photoresist 601 thickness can be designed to allow for optimized process methods to be employed to achieve the desired result. Accordingly, particular embodiments result in partial or full removal of the third layer from the tops of the mesas whilst leaving third layer 501 present at the edges of the device to form part of the device edge termination.

The active structure can then be further processed to make rectifiers of various types. FIGS. 15 to 18 describe further processing that results in one type of rectifier, however alternative rectifier types such as Trench MOS Barrier Schottky devices can also be manufactured here-on. Continuing from FIG. 8a or FIG. 8b, FIG. 15 comprises depositing or thermally growing an insulating layer 1302, which may be of thickness ranging from 5 nm to 100 nm, onto of the mesas and down the sides and the bottom of the trench. This is then followed by trench filling with a gate material 1304 of, for example, poly-silicon or poly-silicon-germanium, which is doped by in-situ doping, subsequent dopant diffusion and or implantation and diffusion to increase the gate conductivity. Alternatively a metal could be used instead of poly-silicon. The gate material is then etched back such that its top surface is planarised to the top surface of the mesa or slightly deeper.

Figure 16:
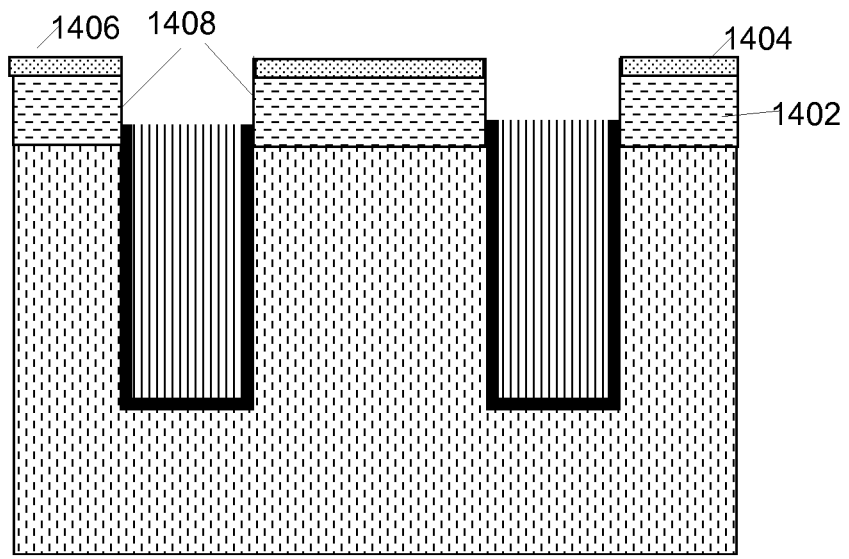
FIG. 16 shows a next stage of the process, whereby impurities of a second conductivity type are implanted and annealed to form regions of second conductivity type according to one embodiment.

FIG. 16 shows a next stage of the process continuing from FIG. 8a according to one embodiment. Dopant of the second impurity type is then implanted into the structure to create the region of second conductivity type 1402, which is then given a temperature treatment to establish a desired doping profile. A further implant at 1404 may then be performed of the second impurity type, designed to be a surface implant in comparison to the previous implant. A sufficiently low temperature treatment is then applied so that the second implant remains substantially at the surface. Insulating layer 1302 is removed from a first portion of the mesa at 1406 on the tops of the mesas and the sidewalls of the exposed trench 1408.

Figure 17:
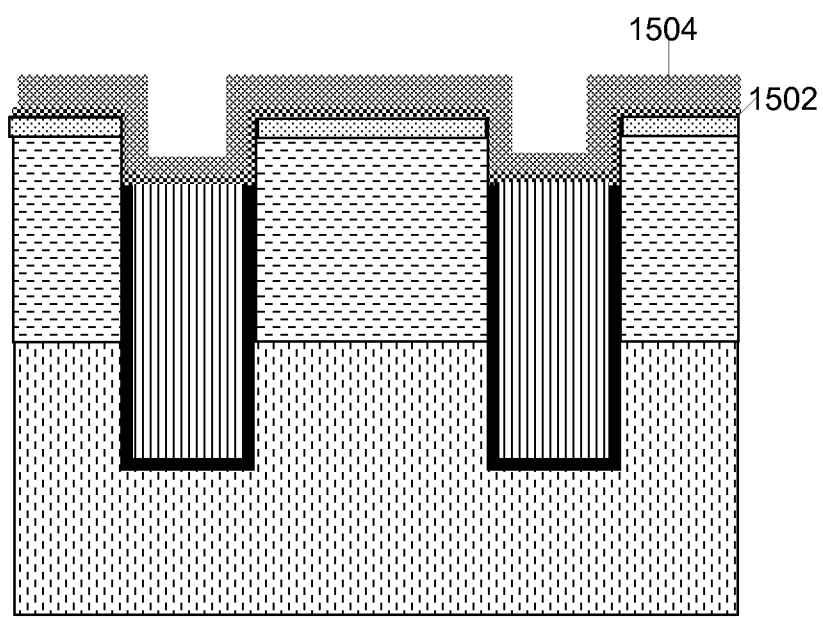
FIG. 17 shows a further stage of the process according to one embodiment.

FIG. 17 shows a next stage of the process according to one embodiment. A contact metal 1502 is deposited—typically titanium but not limited to titanium—followed by a thermal treatment to create a silicide 1504 at exposed surface layers which have an affinity for such a reaction. This provides a low resistance contact to the region of second conductivity type and hence the PN junction formed between region 1402 and region 102, whilst creating a delta-doped layer of second conductivity type of enhanced doping level. The dopant levels can be optimized to create a device having low leakages or low forward voltages dependent on the turn on voltage of the channel current down the sidewall of the trench.

Figure 18:
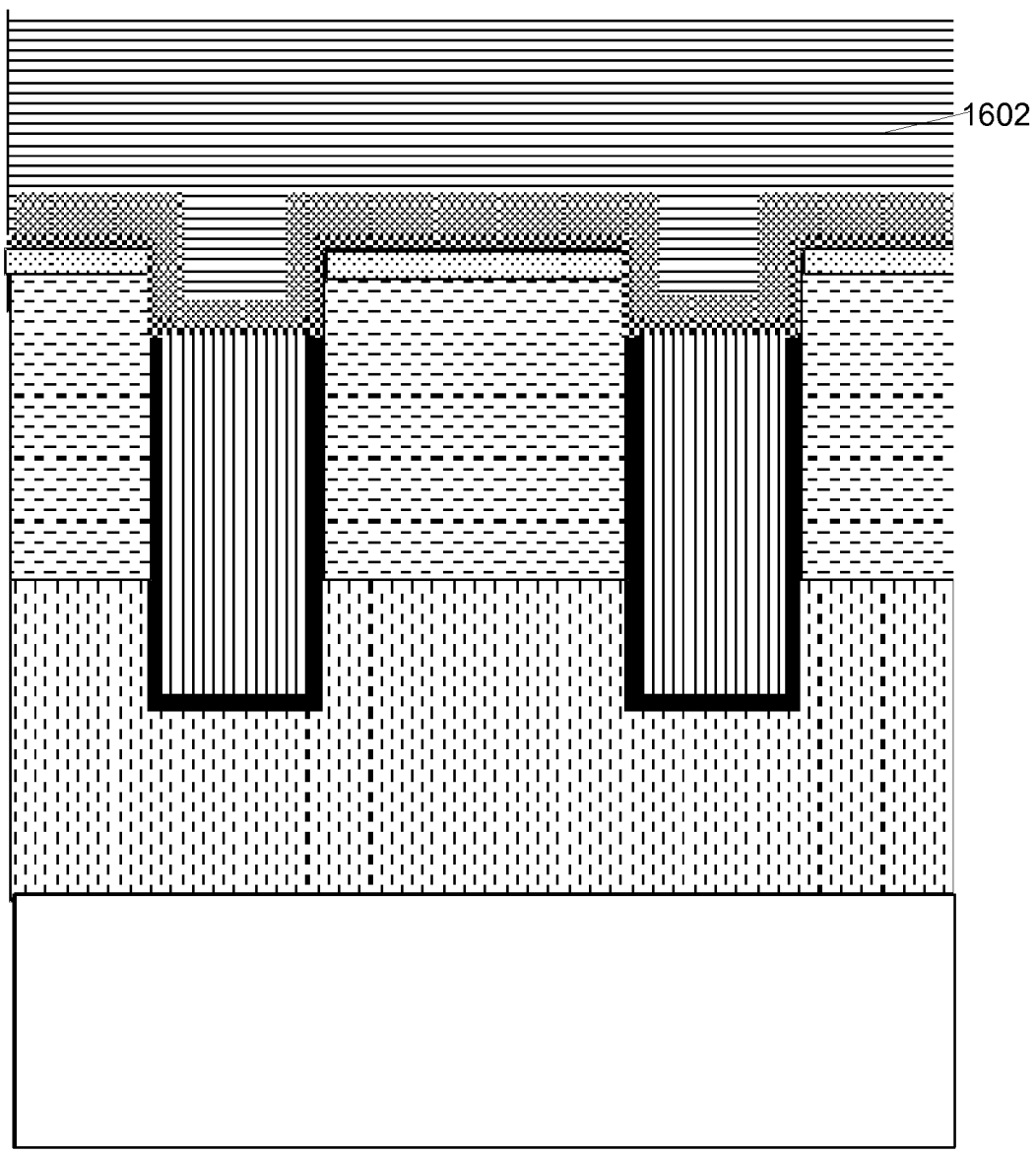
FIG. 18 shows an anode electrode metal deposited and patterned and etched to create the final structure.

In FIG. 18, an anode electrode metal 1602 is then deposited and patterned and etched to create the final structure. The anode metal is pattern at the edge of the device to form a field plate termination structure to reduce edge electric fields and increase the breakdown voltage of the device in reverse bias operation.

Figure 19:
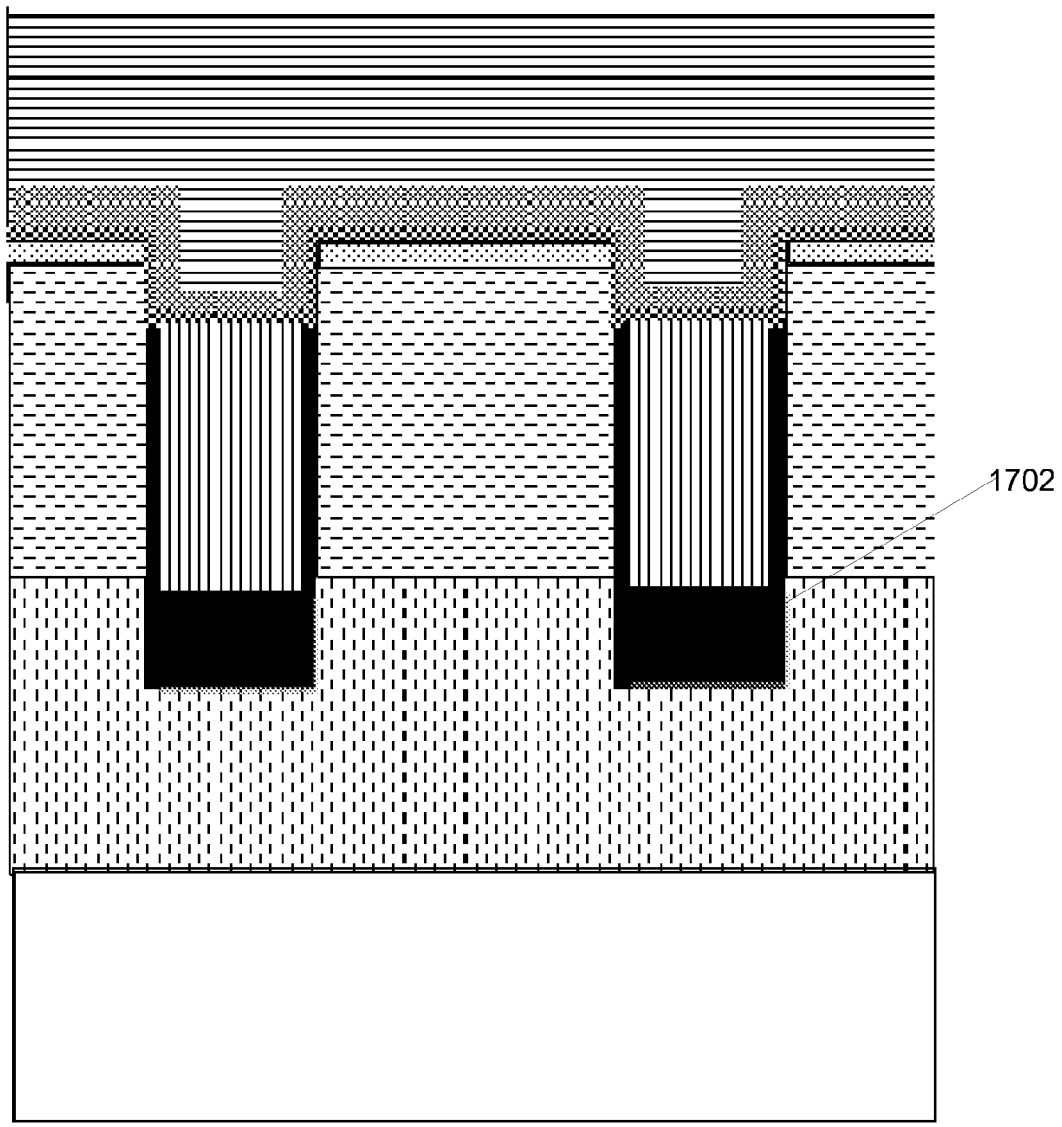
FIGS. 19 and 20 show further embodiments to create a thicker insulating layer at the bottom of the trench, and a floating region of gate material.
Figure 20:
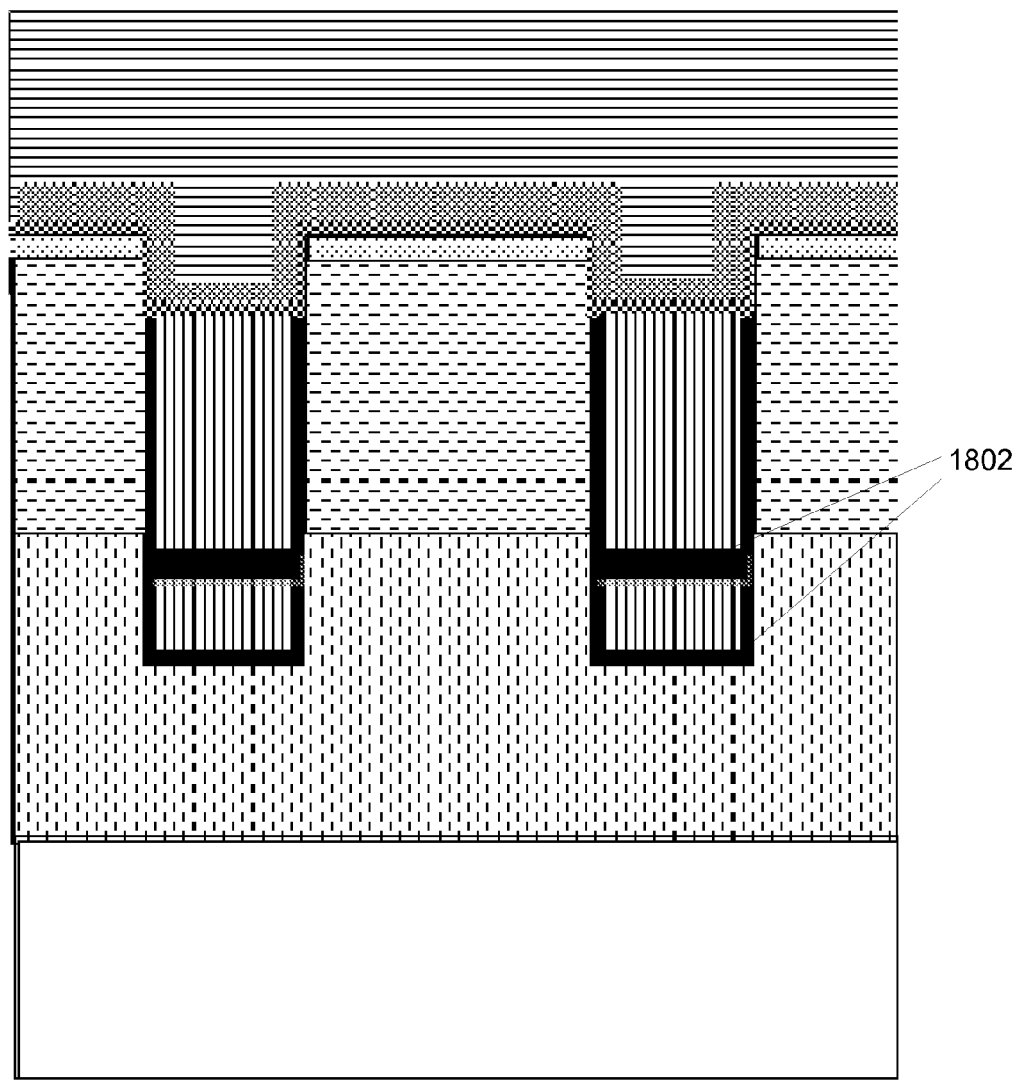

FIGS. 19 and 20 show further embodiments used to create a thicker insulating layer 1702 at the bottom of the trench and a floating region of gate material. Various methods can be utilized to create a thicker oxide at the bottom of the trenches. One such method, for example, would be to locally enhance the oxidation rate of the bottom of the trenches by implantation of Silicon or Flourine ions to enhance oxidation kinetics during growth of the gate oxide.

A split level gate 1802 is shown in FIG. 20. This provides reduced capacitance values by shielding the gate from the cathode potential. The split level gate is processed by a two-stage oxidation and poly-silicon deposition process.

Figure 21:
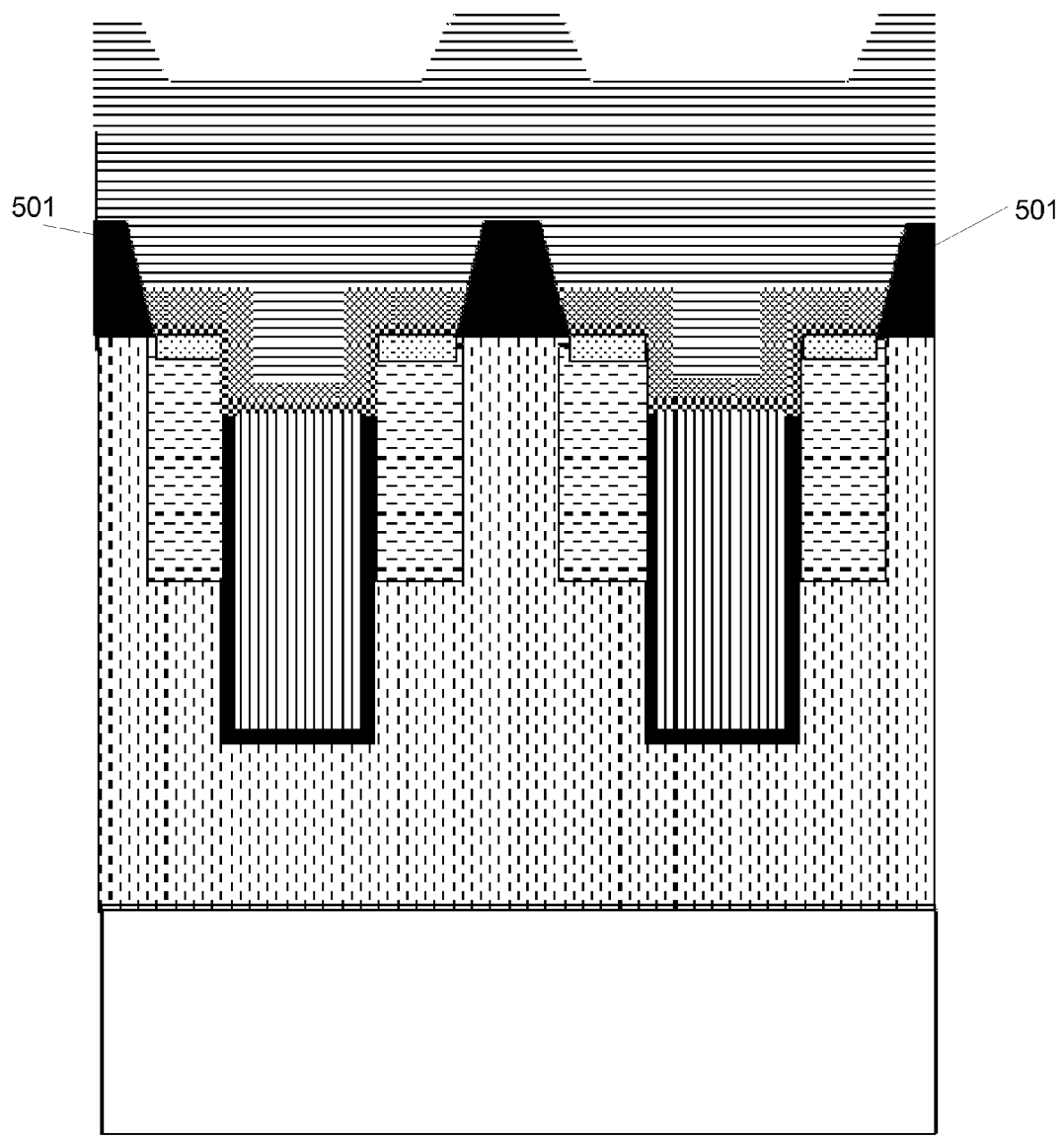
FIG. 21 shows a further embodiment using the method stated here according to one embodiment.

FIG. 21 shows a device structure using the method stated here according to one embodiment. A partial lateral etch of the third layer 501 as shown in FIG. 7 and FIG. 9 is performed. This leads to the structure as shown, which operates with the same function as device shown in FIG. 18.

Figure 22:
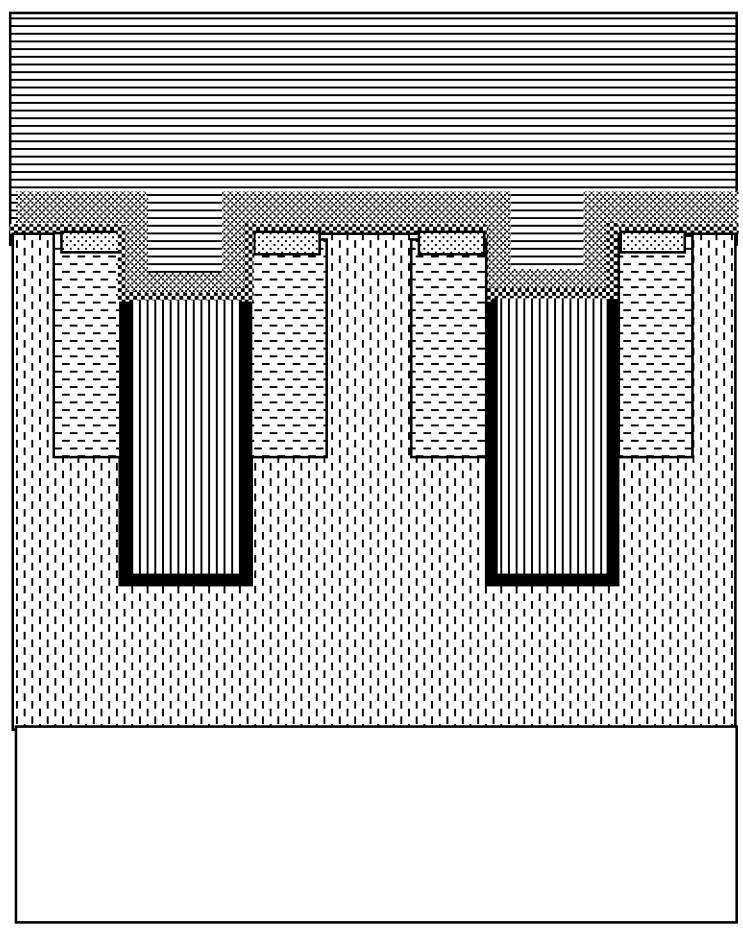
FIG. 22 shows a further embodiment that removes the remaining layer 3 of FIG. 21 prior to silicidation and anode formation.

FIG. 22 shows a further embodiment used to then remove the remaining layer 3 layer on the mesa prior to silicidation and anode formation. This involves an additional masking stage. The benefit of this action is to create a connection to the central part of the mesa region 102 to create a Schottky diode contact in parallel to the PN junction diode and the channel-tunnel diode device operating in region 1402 adjacent to the trench sidewalls Particular embodiments lead to a process to create a power rectifier device comprising a trenched active diode and a termination structure using a minimum amount of processing masking steps. In one embodiment, only two masking stages (trench and metal) are required to create diode operation without a Guard Ring. The use of an initial Guard Ring mask stage as defined in FIG. 2 increases the number of masks used to 3. This embodiment of the process increases the robustness of the device in reverse bias operation, acting as a field relief ring and avalanche diode. This embodiment is shown in FIG. 16.

In summary, particular embodiments described here-in use an etch process that removes electric isolation in the vicinity of the active diode mesa area whilst not removing isolation around the periphery of the device where it is needed to counter high fields during reverse bias operation. Different embodiments are detailed to illustrate practical implementation and variations that allow further improvements to the device.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A method for forming a rectifier device, the method comprising:
    forming a second layer on a first layer in an active structure area and a termination structure area;
    depositing a photoresist layer on the second layer in which a plurality of trench patterns are formed;
    forming a plurality of trenches in the first layer and the second layer based on the trench patterns; and
    laterally etching the second layer to remove the second layer from the active structure area so that the active area is free of the second layer and to remove the second layer from the termination structure area so that a corner portion of the first layer near a trench at the termination structure area is not covered by the second layer.

2. The method of claim 1, wherein the lateral etching removes all of the photoresist layer.

3. The method of claim 1, wherein the lateral etching removes a portion of the photoresist layer.

4. The method of claim 1, wherein the photoresist layer is removed prior to forming the plurality of trenches in the first layer.

5. The method of claim 1, further comprising implanting the second conductivity type to create a region at a top of the mesa and at a bottom of the plurality of trenches.

6. The method of claim 1, wherein the lateral etching uses a wet etch or a dry etch.

7. The method of claim 1, further comprising:
    implanting into the first layer a second impurity type to form a region of second conductivity type in the first layer of the first conductivity type.

\* \* \* \* \*